(12) United States Patent
Harada

(10) Patent No.: US 8,558,448 B2
(45) Date of Patent: Oct. 15, 2013

(54) SEMICONDUCTOR LIGHT EMITTING DEVICE

(75) Inventor: Mitsunori Harada, Tokyo (JP)

(73) Assignee: Stanley Electric Co., Ltd., Tokyo (JP)

( * ) Notice: Subject to any disclaimer, the term of this patent is extended or adjusted under 35 U.S.C. 154(b) by 132 days.

(21) Appl. No.: 13/204,622

(22) Filed: Aug. 5, 2011

(65) Prior Publication Data

US 2012/0033402 A1 Feb. 9, 2012

(30) Foreign Application Priority Data

Aug. 5, 2010 (JP) ................................. 2010-176545

(51) Int. Cl.
*H01J 1/62* (2006.01)
*H01J 63/04* (2006.01)

(52) U.S. Cl.
USPC ............ 313/503; 313/498; 313/506; 313/512

(58) Field of Classification Search
USPC .................................................. 313/498–512
See application file for complete search history.

(56) References Cited

U.S. PATENT DOCUMENTS

| | | | |
|---|---|---|---|
| 2006/0244358 A1* | 11/2006 | Kim et al. | 313/486 |
| 2008/0211386 A1* | 9/2008 | Choi et al. | 313/503 |
| 2009/0116218 A1* | 5/2009 | Liu | 362/84 |
| 2009/0140630 A1* | 6/2009 | Kijima et al. | 313/498 |
| 2010/0013375 A1* | 1/2010 | Maruyama et al. | 313/502 |
| 2010/0053930 A1* | 3/2010 | Kim et al. | 362/84 |
| 2010/0079061 A1* | 4/2010 | Tsai et al. | 313/504 |
| 2010/0103648 A1* | 4/2010 | Kim et al. | 362/97.1 |
| 2010/0207511 A1* | 8/2010 | Harada | 313/501 |
| 2010/0213821 A1* | 8/2010 | Masuda et al. | 313/501 |
| 2011/0006668 A1* | 1/2011 | Hussell et al. | 313/499 |

FOREIGN PATENT DOCUMENTS

| | | |
|---|---|---|
| JP | 2004-179644 A | 6/2004 |
| JP | 2005-277127 A | 10/2005 |
| JP | 2007-134656 A | 5/2007 |
| JP | 4123057 B2 | 7/2008 |
| JP | 2008-258171 A | 10/2008 |

\* cited by examiner

*Primary Examiner* — Anh Mai
*Assistant Examiner* — Kevin Quarterman
(74) *Attorney, Agent, or Firm* — Kenealy Vaidya LLP

(57) ABSTRACT

A light emitting device can make it hard for fluorescence emitted from each phosphor in a color conversion plate to be absorbed by other phosphor. The color conversion plate can include multiple types of phosphors, and the light from a light emitting element can be allowed to reach each of the phosphors efficiently. The color conversion plate can contain at least first and second phosphors which absorb light emitted from the light emitting element and outputs fluorescence. The color conversion plate can have multiple first regions containing the first phosphor on a light emitting element side, being arranged with a predetermined spacing therebetween, and second regions containing the second phosphor on the upper surface, being arranged with a predetermined spacing therebetween. A region where the first regions and the second regions are excluded, as viewed from a location on top of the conversion plate, contains no phosphor.

8 Claims, 16 Drawing Sheets

SEMICONDUCTOR LIGHT EMITTING DEVICE

This application claims the priority benefit under 35 U.S.C. §119 of Japanese Patent Application No. 2010-176545 filed on Aug. 5, 2010, which is hereby incorporated in its entirety by reference.

FIELD OF THE INVENTION

The present invention relates to a semiconductor light emitting device provided with a member which subjects an outgoing beam from a semiconductor light emitting element to wavelength conversion.

DESCRIPTION OF THE RELATED ART

There is known a light emitting element which is formed by arranging two or more types of phosphor layers on the semiconductor light emitting element, and converts the light from the semiconductor light emitting element into light having two or more wavelengths, thereby outputting light which is generated by mixing these various types of light.

By way of example, Japanese Unexamined Patent Application Publication No. 2004-179644 (hereinafter referred to as "patent document 1") and Japanese Unexamined Patent Application Publication No. 2005-277127 (hereinafter referred to as "patent document 2") disclose a structure including two or more phosphor layers being laminated on a semiconductor light emitting element. The two or more phosphor layers absorb light from the semiconductor light emitting element and emit fluorescence having a predetermined wavelength. On this occasion, the laminate order of the phosphor layers is configured in such a manner that a layer arranged closer to the semiconductor light emitting element emits the fluorescent having a longer wavelength. Specifically, a red phosphor layer for outputting red fluorescent and a green phosphor layer for outputting green fluorescent are laminated in this order on the semiconductor element which outputs blue light. With this laminate order, the red fluorescence outputted from the red phosphor layer is not absorbed by the green phosphor layer arranged thereon, and therefore, it is possible to acquire high luminous intensity.

Japanese Unexamined Patent Application Publication No. 2007-134656 (hereinafter, referred to as "patent document 3") discloses a light emitting device in which a plate-like member made up of three phosphor layers being laminated is arranged on a light emitting element which emits ultraviolet radiation. The layers of three-layer phosphor absorb the ultraviolet radiation, and emit red, green, and blue fluorescence respectively, being arranged in this order from the light emitting element side, so that white light is outputted, which is obtained by mixing the three colors. Since the three layers are arranged in such a manner as described above, the fluorescence emitted from each of the phosphor layers is not absorbed by the other phosphor layer arranged thereon, and it is possible to enhance light extraction efficiency.

Japanese Patent No. 4123057 (hereinafter, referred to as "patent document 4") discloses a structure in which a color converting material is arranged on the light emitting element, and in-plane concentration distribution of the color converting material is decreased along the direction from the center to the outer periphery, in order to solve a problem that brightness unevenness or color unevenness may occur according to the observation angle. Specifically, the patent document 4 discloses a structure in which grooves are provided on a transparent member, and the grooves are filled with a phosphor. Here, the depth of the groove is made to be shallower as it becomes closer to the outer periphery, or a distance between the grooves is made to be larger as it becomes closer to the outer periphery.

Japanese Unexamined Patent Application Publication No. 2008-258171 (hereinafter, referred to as "patent document 5") discloses a configuration in which cells made of red, green, and blue phosphors respectively are spread in planar state, in such a manner that those three phosphors do not overlap one another in the optical path direction, and also discloses a wavelength convertor which allows the fluorescence generated from each phosphor not to be absorbed by the other phosphor.

Any of the configurations disclosed in the aforementioned patent documents 1, 2, and 3 are directed to suppress a problem, i.e., when an absorption edge of the red phosphor is located at a longer wavelength side than the green wavelength, and the red phosphor layer is placed on the upper side of the green phosphor layer, green light emitted from the green phosphor layer is absorbed by the red phosphor layer, whereby the luminous intensity is lowered. However, in the semiconductor light emitting device with such configuration as described above, most of the light outputted from the light emitting element, e.g., a blue light emitting element, is absorbed by the red phosphor layer arranged on the element side, and only a part of the light having not been absorbed is allowed to reach the green light emitting phosphor layer, and subjected to the wavelength conversion. Therefore, there is a problem that the light outputted from the semiconductor light emitting element cannot be utilized efficiently as exciting light.

Similarly, in order to obtain white color by mixing colors, if it is structured such that the light emitting element which outputs ultraviolet radiation is used, and the phosphor layers made up of three layers; blue, green, and red, are laminated thereon, most of the ultraviolet radiation from the light emitting element is absorbed by the green and red phosphors. Therefore, the intensity of the ultraviolet radiation which reaches the blue phosphor is reduced, causing poor efficiency in wavelength conversion.

The technique described in the patent document 4 adjusts the in-plane concentration distribution of the color conversion material in order to reduce brightness unevenness according to the observation angle. However, in here, the phosphor being used is just one type, and this does not solve the problem that exciting light or fluorescence is absorbed between multiple phosphors.

The technique described in the patent document 5 includes the color conversion material in which cells of three types of phosphors are spread in planar state. However, since the wavelengths of the fluorescence emitted from the respective cells are different from one another, there is a possibility that chromatic unevenness may occur in the in-plane direction.

An aspect of the present invention is to provide a light emitting device, in which fluorescence outputted from each of phosphors of the color conversion plate containing multiple types of phosphors, is hard to be absorbed by the other phosphor, and the light from the light emitting element is allowed to reach each of the phosphors efficiently.

SUMMARY OF THE INVENTION

The semiconductor light emitting device according to the first aspect of the present invention is provided with a light emitting element, and a color conversion plate being mounted on the light emitting element, the color conversion plate containing at least a first phosphor and a second phosphor which absorb light emitted from the light emitting element to output fluorescence. Here, the color conversion plate is provided with, on a surface on the light emitting element side, multiple first regions each including the first phosphor, being arranged with a predetermined spacing therebetween, whereas on an upper surface, second regions each including the second phosphor being arranged with a predetermined spacing therebetween, and the region excluding the first regions and the second regions contains no phosphor.

It is preferable that a fluorescent wavelength of the first phosphor is longer than the fluorescent wavelength of the second phosphor.

It is preferable that a center position or a central axis of the first region does not overlap the center position or the central axis of the second region, in a principal plane direction of the color conversion plate.

It is possible to configure the multiple first regions and the multiple second regions in such a manner that they are scattered like dots or arranged like stripes, when the color conversion plate is viewed from the top.

Each of the first region and the second region may have an outer shape viewed from the top of the color conversion plate, being any of a circle, a triangle, a quadrangle, and a polygon. In addition, each of the first region and the second region may have an outer shape viewed from the side of the color conversion plate, being any of a semicircle, a triangle, and a quadrangle.

The semiconductor light emitting device according to the second aspect of the present invention is provided with a light emitting element, and a color conversion plate being mounted on the light emitting element, the color conversion plate containing at least a first phosphor and a second phosphor which absorb light emitted from the light emitting element to output fluorescence. The color conversion plate has multiple first regions and second regions penetrating the plate from the surface on the light emitting element side to an opposed surface. The first region includes the first phosphor, the second region includes the second phosphor, and the first region and the second region are arranged alternately with a predetermined spacing therebetween, when viewed from the top of the color conversion plate. The region excluding the first region and the second region contains no phosphor.

Each of the first region and the second region may have a shape being any of a circular cylinder, a triangular cylinder, a quadrangular cylinder, and a polygonal cylinder.

According to the present invention, light from the light emitting element is allowed to easily reach the first phosphor and the second phosphor, and the fluorescence being emitted is hardly absorbed by other phosphors, thereby enhancing light extraction efficiency.

DESCRIPTION OF THE PREFERRED EMBODIMENTS

A light emitting device according to one embodiment of the present invention will be explained with reference to the accompanying drawings.

<First Embodiment>

The light emitting device according to the first embodiment is a device for converting a part of blue light outputted from a blue light emitting flip-chip element, into red light and green light by using a color conversion plate, so as to emit white light which is obtained by mixing the blue, red, and green light.

Figure 1:
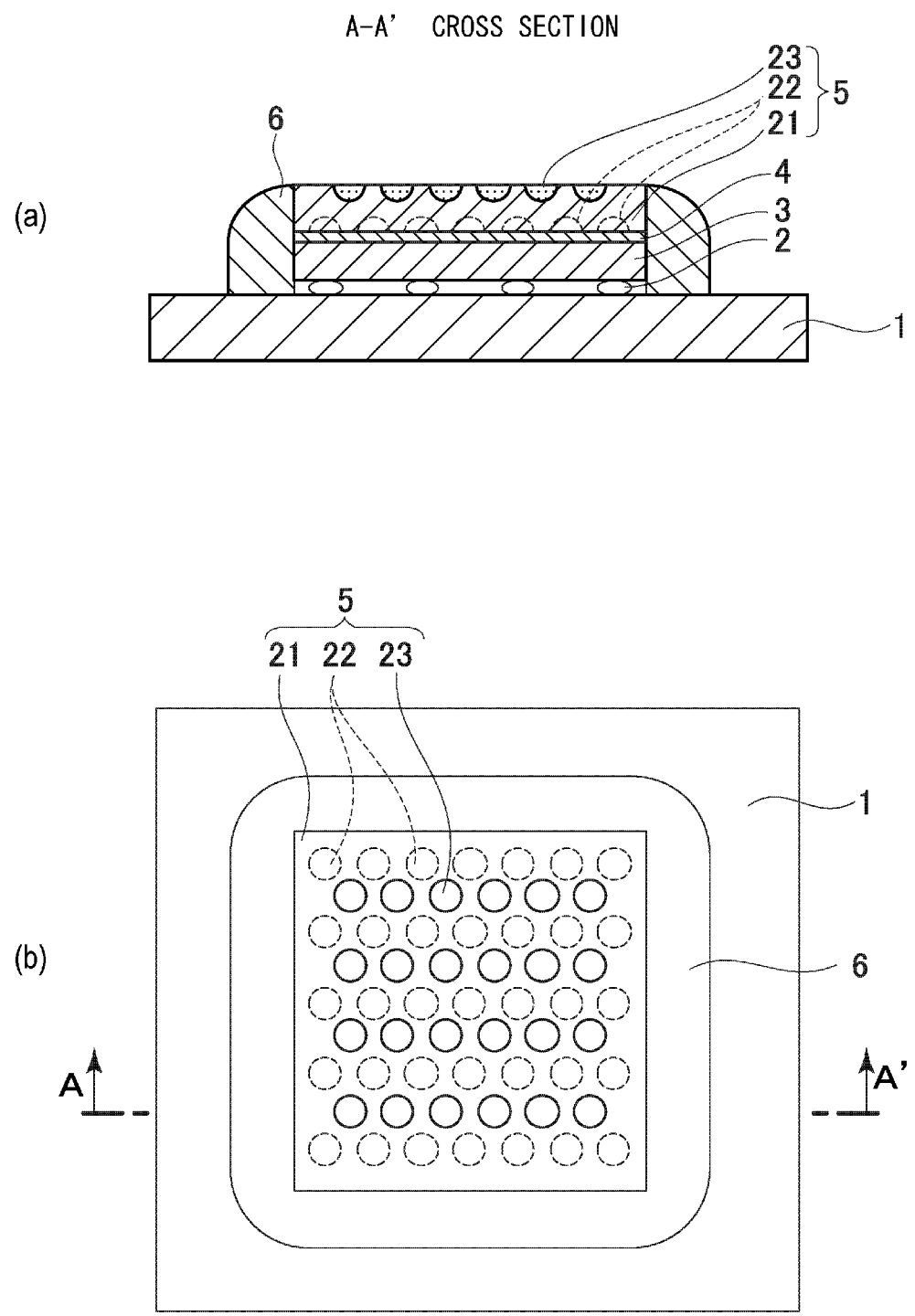
FIG. 1(a) illustrates a sectional view and FIG. 1(b) illustrates a top view of a flip-chip type semiconductor light emitting device according to the first embodiment.

FIG. 1(a) illustrates a sectional view and FIG. 1(b) illustrates a top view of the light emitting device according to the first embodiment. As shown in FIG. 1(a), a flip-chip type semiconductor light emitting element 3 is implemented using Au bumps 2 on a substrate 1 on which electrode and wiring are formed in advance. On the semiconductor light emitting element 3, there is mounted a color conversion plate 5 via a transparent adhesion layer 4. Side surfaces of the semiconductor light emitting element 3 and the color conversion plate 5 are surrounded by an optical reflection frame 6.

The flip-chip type semiconductor light emitting element 3 includes, though not illustrated, an element substrate being transparent to the blue light, and a light emitting layer laminated thereon, and the light emitting layer is arranged on the substrate 1 side, and the element substrate is arranged facing to the color conversion plate 5 side. The light emitting element 3 emits blue light.

The color conversion plate 5 has a plate-like shape, and on the lower surface (on the surface of the semiconductor light emitting element 3 side), multiple hemispherical red phosphor regions 22 are arranged with a predetermined spacing therebetween, and on the upper surface (on the surface of the light outputting side), multiple hemispherical green phosphor regions 23 are arranged with a predetermined spacing therebetween. The red phosphor regions 22 and the green phosphor regions 23 are arranged in such a manner that they do not overlap each other when viewed from the top of the color conversion plate 5. The region 21 excluding the red phosphor regions 22 and the green phosphor regions 23 is transparent to red, green, and blue colors, and any phosphors are not dispersed thereon.

Preferably, a material used as a base material for the red phosphor region 22 is transparent to the red, green, and blue light, and the material is formable by a printing method. For example, a thermosetting resin such as an epoxy resin and a silicone resin may be employed. In the red phosphor region 22, there is dispersed a phosphor which emits red fluorescence using the blue light as exciting light. For example, $CaAlSiN_3:Eu$, $(Ca,Sr)_2Si_5N_8:Eu$, $(Ca,Sr)S:Eu$ may be employed. In the green phosphor region 23, there is dispersed a phosphor which emits green fluorescence using the blue light as exciting light. For example, $(Ba,Sr)_2SiO_4:Eu$, $CaSc_2O_4:Ce$, $(Ca,Sr)Ga_2S_4:Eu$, $Ca_8MgSi_4O_{16}Cl_2:Eu$, and $(Si,Al)_6(O,N)_8:Eu$ may be employed. Preferably, a material used as the base material for the green phosphor region 23 is transparent to the red, green, and blue light, and the material is formable into a predetermined shape by the printing method. By way of example, a thermosetting resin may be employed, such as an epoxy resin and a silicone resin.

Preferably, a material used for the transparent region 21 is transparent to the red, green, and blue light, and the material is processible into a concave shape. By way of example, a glass, an epoxy resin, a silicone resin, or the like, may be employed.

Since the color conversion plate 5 is configured as described above, it is a plate having a sea-island structure where the hemispherical red phosphor regions 22 and the hemispherical green phosphor regions 23 are formed like islands in the region 21 (sea region) where no phosphors are dispersed.

The transparent adhesion layer 4 is a layer made of adhesive agent for bonding the color conversion plate 5 on the semiconductor light emitting element 3, and it is made of a material which is at least transparent to blue light.

The optical reflection frame 6 is made of a material which is obtained by dispersing fillers having various reflective indexes in a resin. For example, titanium oxide, aluminum oxide, a barium sulphate, or the like may be appropriately selected as the filler.

Figure 2:
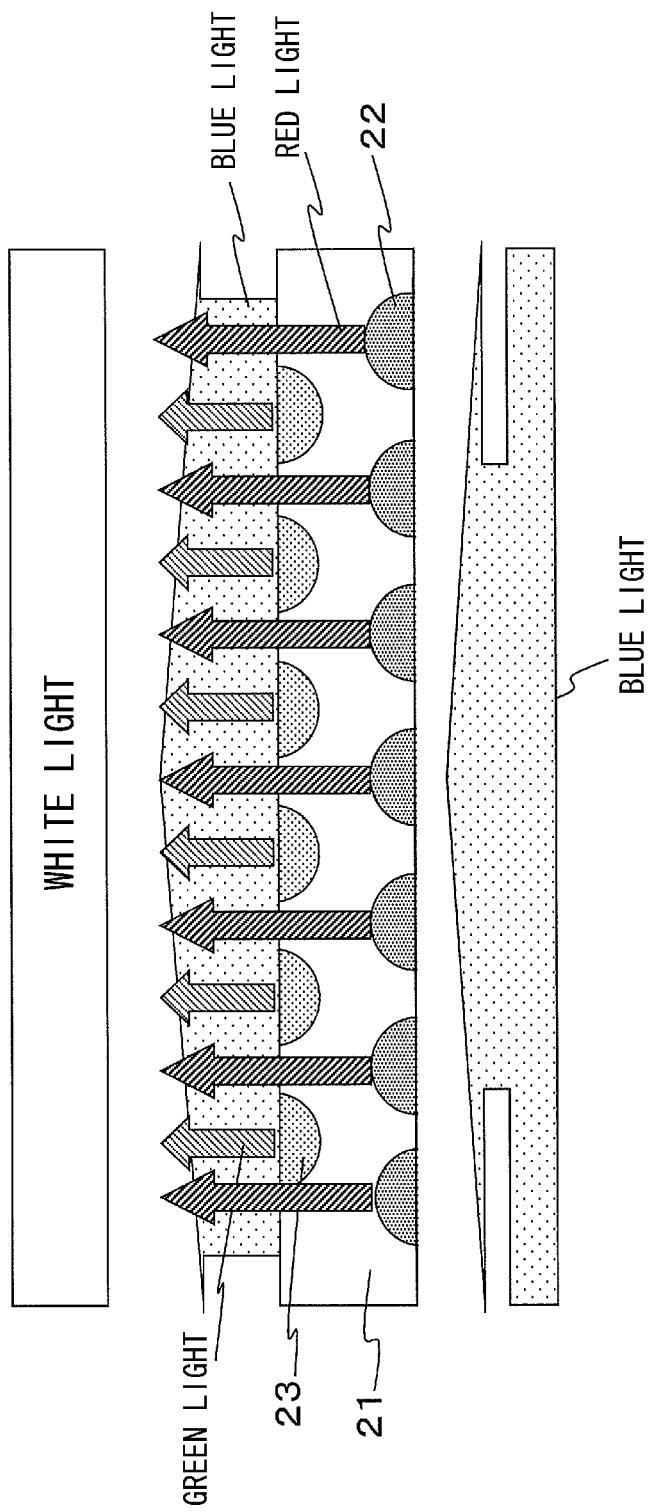
FIG. 2 illustrates an operation of a color conversion plate 5 of the semiconductor light emitting device as shown in FIG. 1.

In the light emitting device according to the embodiment as described above, the blue light outputted from the light emitting element 3 passes through the transparent adhesion layer 4, and enters the lower surface of the color conversion plate 5 (the surface on the light emitting element 3 side). As shown in FIG. 2, the color conversion plate 5 is configured in such a manner that the red phosphor region 22 are scattered on the lower surface of the color conversion plate 5 and the phosphor region 21 spreads therebetween. Therefore, a part of the blue light enters the red phosphor regions 22, other part passes through the transparent region 21 to enter the green phosphor region 23, and further, remaining part passes through the transparent region 21 to be directly outputted from the upper surface. Accordingly, there are emitted from the upper surface of the color conversion plate 5, red fluorescence emitted from the red phosphor region 22 which is excited by the blue light, green fluorescence emitted from the green phosphor region 23 which is excited by the blue light, blue light that has not been absorbed by neither the red phosphor region 22 nor the green phosphor region 23, and blue light directly emitted through the transparent region 21. Therefore, white light obtained by mixing the red light, green light and the blue light is outputted from the upper surface of the color conversion plate 5.

Figure 3:
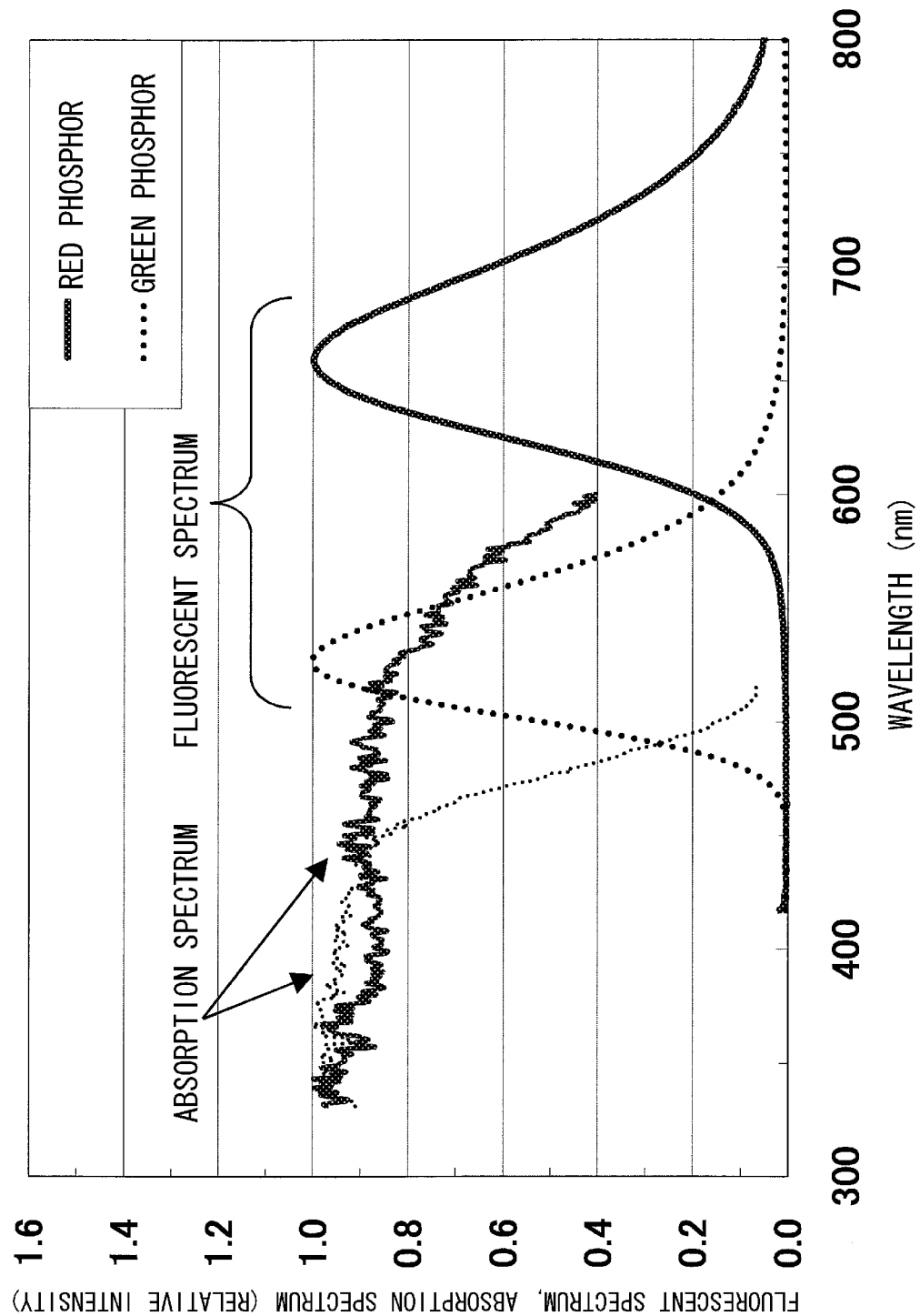
FIG. 3 is a graph showing an absorption spectrum and a fluorescent spectrum of a red phosphor and a green phosphor according to the first embodiment.

On this occasion, a part of the red fluorescence generated from the red phosphor region 22 passes through the transparent region 21, further goes through the green phosphor region 23, and then it is outputted from the upper surface of the color conversion plate 5. An absorption edge of the absorption spectrum of the green phosphor is located on the shorter wavelength side than the red light wavelength range as shown in FIG. 3. Therefore, the red phosphor is allowed to pass through the green phosphor region 21 without being absorbed, and the intensity of the red phosphor is not attenuated.

On the other hand, most of the light going upward, out of the green phosphor generated in the green phosphor region 23, is outputted from the upper surface of the color conversion plate 5 without passing through the red phosphor region 22. Since the absorption edge of the absorption spectrum of the red phosphor partially overlaps the green light wavelength range, the red phosphor absorbs the green phosphor. However, in the present embodiment, the light going upwardly out of the green fluorescence, is allowed to reach the upper surface of the color conversion plate 5 without passing through the red phosphor region 22. Therefore, the green phosphor can be outputted with little attenuation.

Since the optical reflection frame 6 surrounds the side surfaces of the light emitting element 3 and the color conversion plate 5, it is possible to efficiently reflect the light, which is outputted from the side surfaces of the transparent substrate of the light emitting element 3, allowing the light to enter the color conversion plate 5. Accordingly, it is possible to enhance color conversion efficiency and light output efficiency of the color conversion plate.

In addition, the red phosphor region 22 is shaped like a hemisphere, and therefore, the interface with the transparent region 21 has a hemispherical shape. Since the fluorescence emitted radially from the phosphor of the island part (red phosphor region 22) enters the interface with the sea part at a right angle or approximately right angle, the light is hardly reflected by the interface and allowed to enter the transparent phosphor region 21 with a high degree of efficiency. Accordingly, there is an effect that the light extraction efficiency of red fluorescence from the red phosphor region 22 is more enhanced, relative to a structure of a conventional art where a layer of the red phosphor dispersed resin and a layer of the green phosphor dispersed resin are laminated.

The light emitting device of the present embodiment adjusts a contained amount of the phosphor and a size (diameter) of the hemispherical region being the red phosphor region 22, thereby enabling adjustment of red light intensity. Since the adjustment of the size of the red phosphor region 22 may change the amount of the blue light entering the green phosphor region 23 through the transparent region 21, the intensity of the green light is also changed. Furthermore, by adjusting the contained amount of the phosphor and the size (diameter) of the hemispherical region being the green phosphor region 23, it is possible to adjust the intensity of the green light. As thus described, according to the adjustment of the phosphor region and the size of each of the red phosphor region 22 and the green phosphor region 23, it is possible to change chromaticity and brightness of the white light to a desired value.

It is to be noted that the homogeneity in chromaticity and brightness of the white light is influenced by the diameters of the island-like red phosphor region 22 and green phosphor region 23. Therefore, these diameters are adjusted so that necessary chromatic homogeneity can be obtained. If one side of the color conversion plate 5 is around 1 mm, it is preferable that the diameter of one region 22 or 23 is approximately between or equal to 20 µm and 200 µm, and spacing between the regions 22 and between the regions 23 is approximately between or equal to 20 µm and 200 µm, since these ranges enhance the chromatic homogeneity.

It is further possible that the color conversion plate 5 of the present embodiment is obtained by using a general printing method, and one sheet of large-area plate is produced for a large number of pieces being continuous, and individual pieces are cut out, thereby enabling a production of a large number of pieces at one time. Therefore, a color conversion function of each color conversion plate 5 is uniform within an identical lot (an identical large-area plate), and it is possible to considerably enhance yields of the product with less variation in color, compared to a conventional art in which a color conversion material is coated and formed on an individual semiconductor light emitting element.

Hereinafter, a method for producing the color conversion plate 5 will be explained, with reference to FIG. 4(a) to FIG. 4(d).

Firstly, a substrate (region 21) is prepared, on which hemispherical concave portions 41 and 141 are formed at offset positions on both surfaces. By way of example, this substrate (region 21) maybe a molten glass molding plate or an injection-molding plate using an epoxy resin, a silicone resin, or a composite resin thereof. On both surfaces of the substrate, hemispherical concave portions are molded by a transfer using a template. On this occasion, the concave portions 41 and 141 are respectively formed on both surfaces at the positions which do not overlap one another.

Figure 4:
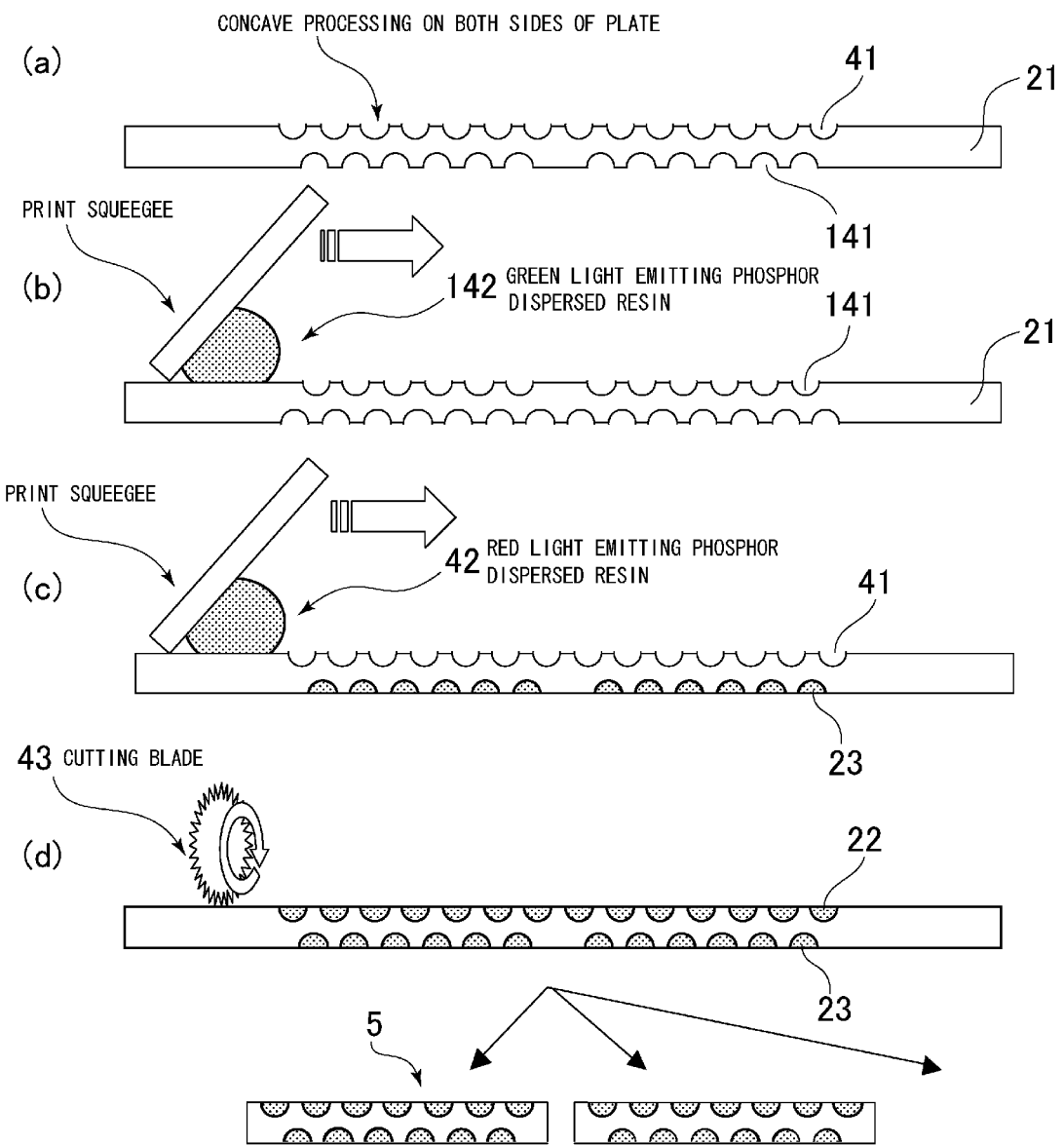
FIG. 4(a) to FIG. 4(d) illustrate a production process of the color conversion plate 5 according to the first embodiment.

Next, as shown in FIG. 4(b), the concave portions 141 are filled with a thermosetting resin 142 in which a predetermined concentration of the green phosphor is dispersed, by using a squeegee printing method, a dropping method, or the like, and then the thermosetting resin is hardened. The resin being filled forms the green phosphor region 23.

Next, as shown in FIG. 4(c), the substrate is turned upside down, and the concave portions 41 are filled with a thermosetting resin 42 in which a predetermined concentration of the red phosphor is dispersed, by using a squeegee printing method, or the like. Then, the thermosetting resin is hardened. The resin being filled forms the red phosphor region 22.

Figure 14:
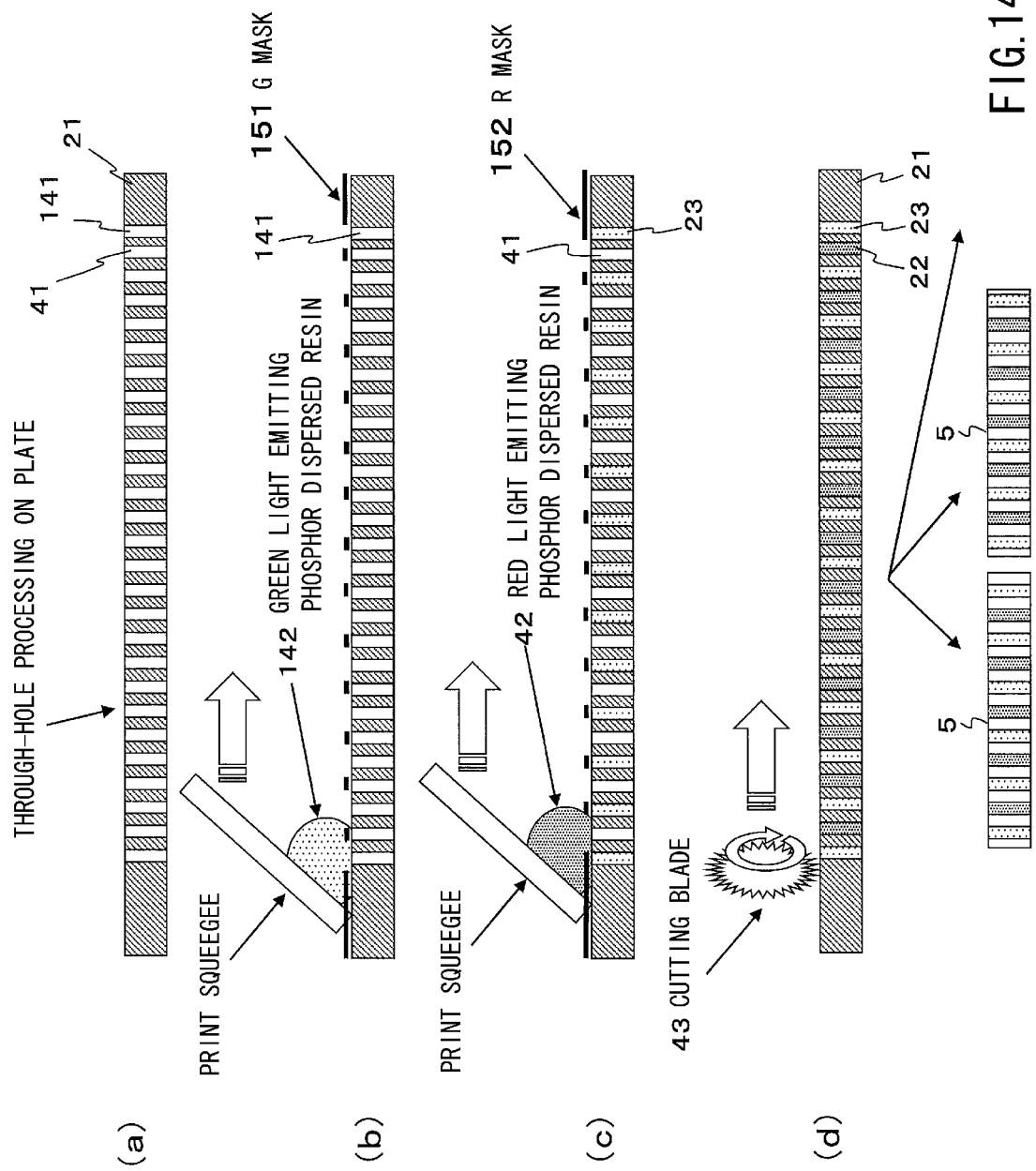
FIG. 14(a) to FIG. 14(d) illustrate a production process of the color conversion plate 5 according to the seventh embodiment.

Finally, as shown in FIG. 14(d), the substrate is cut into a size equivalent to or larger than the size of the light emitting element 3, by using a cutting blade 43 or the like, thereby producing the color conversion plate 5.

A semiconductor light emitting element 3 for emitting blue light is mounted via flip-chip bonding, on a substrate 1 prepared separately, by using Au bump 2. Thereupon, a transparent adhesion layer 4 is formed thereon, and the color conversion plate 5 is mounted thereon, in such a manner that the surface where the red phosphor regions 22 are formed faces to the light emitting element 3 side.

Finally, a resin such as a thermosetting resin in which filler such as titanium oxide is dispersed, coats all over the side surfaces of the light emitting element 3 and the color conversion plate 5, by using a dispenser coating applicator or the like, and subsequently, it is hardened. According to the steps as described above, the light emitting device as shown in FIG. 1(a) and FIG. 1(b) is completed.

It is to be noted that in the present embodiment, the shape of each of the red phosphor region 22 and the green phosphor region 23 is a half circle, when viewed from the side surface. However, this is not necessarily a perfect half circle. As far as the interface with the transparent region 21 is a curved convex shape, the same operation and effect may be obtained.

In the present embodiment, the red phosphor region 22 and the green phosphor region 23 do not overlap one another when viewed from the top. However, this is not the only example. For example, just around edge portions of those regions may be allowed to overlap one another. However, even in this case, preferably, those regions are arranged in such a manner that the center positions of these regions do not overlap one another, so as to allow the blue light not passing through the red phosphor region 22 to reach the green phosphor region 23.

Further in the present embodiment, there is provided a region including only the transparent region 21, which do not overlap any of the red phosphor region 22 and the green phosphor region 23 when viewed from the top. However, this is not the only configuration as far as a desired chromaticity of the white light can be sufficiently achieved only by the blue light passing through each of the phosphor regions without being absorbed. The transparent region 21 may overlap any of the phosphor regions by necessity.

<Second Embodiment>

Figure 5:
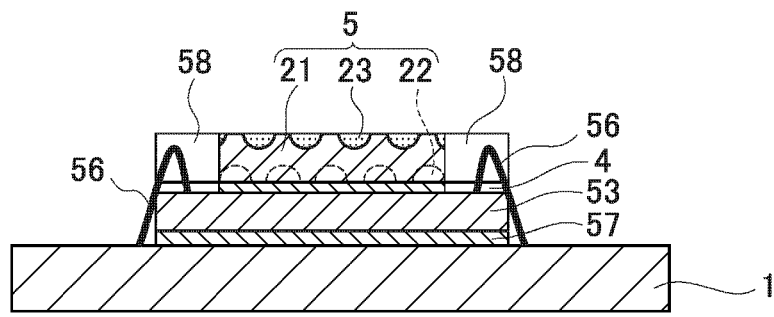
FIG. 5(a) illustrates a sectional view and FIG. 5(b) illustrates a top view of a metal-bonding type semiconductor light emitting device according to the second embodiment.
Figure 5:
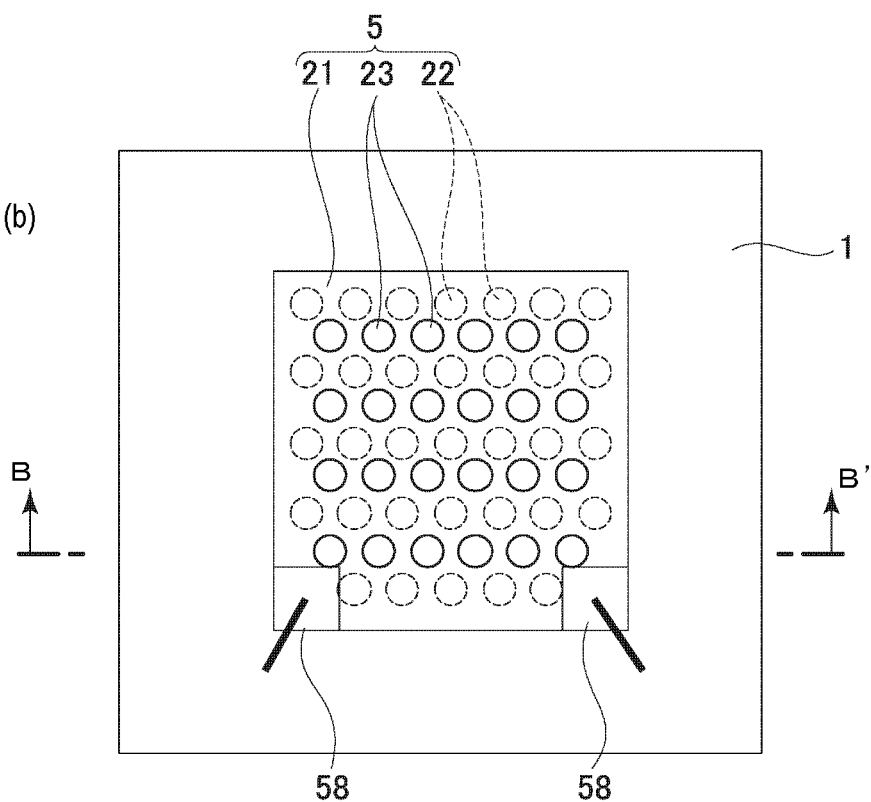

The light emitting device according to a second embodiment will be explained with reference to FIG. 5(a) and FIG. 5(b). In the light emitting device as shown in FIG. 5(a) and FIG. 5(b), a semiconductor light emitting element 53 which emits blue light is implemented on the substrate 1 where electrode and wiring are formed in advance, by using AuSn eutectic 57 and Au bonding wire 56. The color conversion plate 5 is bonded on the semiconductor light emitting element 53 via the transparent adhesion layer 4.

The semiconductor light emitting element 53 includes an element substrate and a light emitting layer formed thereupon. The element substrate is a metal bonding (Metal Bonding: MB) element which is opaque to blue light. Hereinafter, in the present embodiment, the semiconductor light emitting element 53 is referred to as MB element 53. The MB element 53 is bonded to the substrate 1 by die bonding via AuSn eutectic 57, allowing the element substrate to face the substrate 1 and the light emitting layer to face the color conversion plate 5. An Au wire pad, not illustrated, is formed on the upper surface of the MB element 53, and it is connected to the electrode on the substrate 1 via the bonding wire 56.

Structures of the regions 21, 22, and 23 of the color conversion plate 5 are the same as those in the first embodiment, but it is necessary that they are arranged in such a manner as avoiding the region where the bonding wire 56 is bonded on the upper surface of the MB element 53. Therefore, in the second embodiment as shown in FIG. 5(a) and FIG. 5(b), a notch 58 is provided on the edge of the color conversion plate 5.

Figure 6:
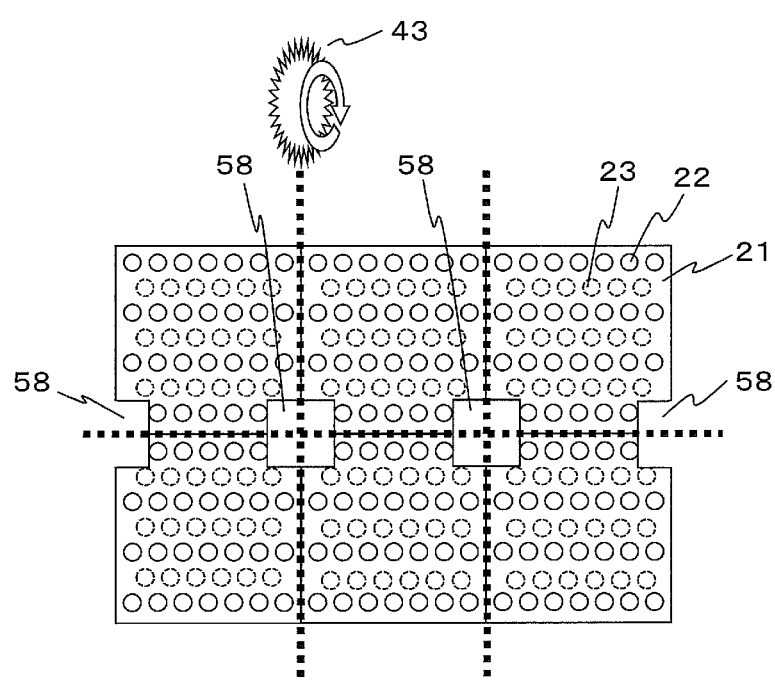
FIG. 6 illustrates a position where a large-area plate is cut out and a shape of a notch 58, in a process for producing the color conversion plate 5 as shown in FIG. 5.

A method for producing the color conversion plate 5 according to the second embodiment is the same as the production method of the first embodiment as shown in FIG. 4(a) to FIG. 4(c). However, in the second embodiment, when the green phosphor dispersed plate is subjected to die machining in the step of FIG. 4(a), the notch 58 is formed as a hole which corresponds to a shape of the Au wire pad on the light element 3 surface, as shown in FIG. 6. It is to be noted that on a large-area plate, a hole portion is formed, which is commonly used for combined notches 58 of adjacent color conversion plates 5, thereby facilitating the process. A process for partitioning can be performed with a high degree of precision, thereby enabling mass production.

When the green phosphor region 23 and the red phosphor region 22 being the island parts are formed in the steps of FIG. 4(b) and FIG. 4(c), the squeegee printing method or the like may be applied as in the case with the first embodiment. However, it is desirable to cover the notch 58 with a mask, in order to avoid that the notch 58 is filled with phosphors.

In the step of FIG. 4(d), the large-area plate is cut out by the cutting blade in such a manner as shown in FIG. 6, thereby producing the color conversion plate with the notch 58 being formed.

An operation and effect of the color conversion in the light emitting device according to the second embodiment are the same as those of the first embodiment.

<Third Embodiment>

Figure 7:
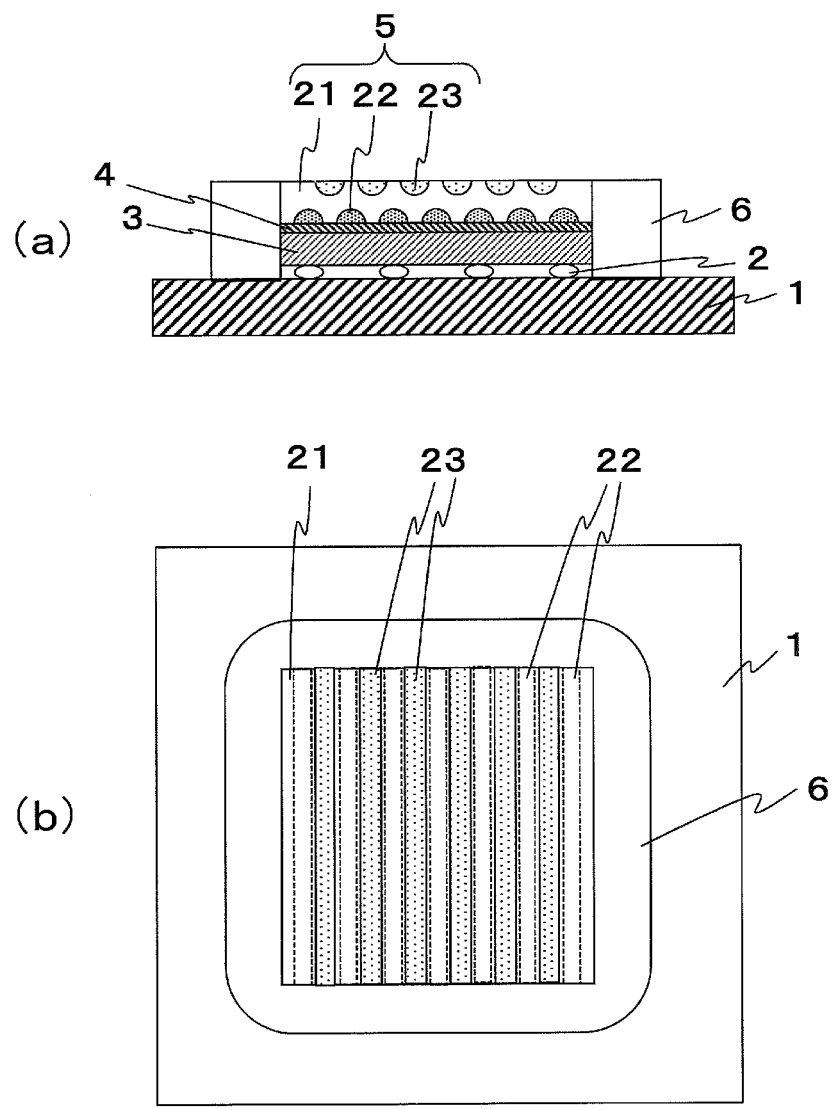
FIG. 7(a) illustrates a sectional view and FIG. 7(b) illustrates a top view of a semiconductor light emitting device according to the third embodiment.

Next, the light emitting device according to a third embodiment will be explained. As shown in FIG. 7(a) and in FIG. 7(b) which illustrate a sectional view and a top view of the device, respectively, the light emitting device according to the third embodiment includes the red phosphor region 22 and the green phosphor region 23 each having a stripe-like shape with a section a half circle, in other words, being a shape obtained by cutting a cylinder into half in the axial direction. Multiple red phosphor regions 22 are arranged in parallel with a predetermined spacing therebetween on the lower surface side of the color conversion plate 5. On the upper surface side of the color conversion plate 5, multiple green phosphor regions 23 are arranged in parallel with a predetermined spacing therebetween. The center axis of the red phosphor region 22 and the center axis of the green phosphor region 23 are arranged at offset positions, so as to avoid that those center axes overlap one another when viewed from the top of the color conversion plate 5.

The light emitting device of the present embodiment is the same as that of the first embodiment, other than the shape of the red phosphor region 22 and the green phosphor region 23, and therefore, additional explanation will not be made.

The present embodiment is also the same as the first embodiment in the operation that the blue light outputted from the light emitting element 3 passes through the color conversion plate 5, thereby obtaining the red phosphor, green phosphor, and blue transmission light, and accordingly mixture of those elements allows acquisition of white light.

In the third embodiment, the shape of the red phosphor region 22 and the green phosphor region 23 is like a stripe. Accordingly, compared to the first embodiment where the color conversion plate 5 is provided with hemispherical regions 22 and 23, it is possible to make the area of the transparent region 21 smaller on the lower surface of the color conversion plate 5, by narrowing the spacing between the adjacent red phosphor regions 22. Similarly, the area of the transparent region 21 between the green phosphor regions 23 is also made smaller. With this configuration, a ratio of the blue light passing through the transparent region 21 of the color conversion plate 5 is reduced more than the first embodiment, thereby allowing the ratio of the red fluorescence and the green fluorescence to increase. On the other hand, the width of the red phosphor region 22 and the green phosphor region 23 is made narrower, thereby allowing the ratio of the blue light to increase. As thus described, since the ratio of the blue light contained in the light outputted from the upper surface of the color conversion plate 5 is more adjustable than the first embodiment, an effect is produced that the chromaticity of the light outputted from the color conversion plate 5 is extensively adjustable. This is because, in the first embodiment, even in the case where two-dimensional arrangement of the circles of the red phosphor regions 22 and the green phosphor region 23 are close-packed, a star-like gap still remains. On the other hand, in the present embodiment, the stripe shape allows the gap to be approximate zero.

It is to be noted that the homogeneity in chromaticity and brightness of the white light is influenced by the widths of the red phosphor region 22 and green phosphor region 23. Therefore, these widths are adjusted so that necessary chromatic homogeneity can be obtained. If one side of the color conversion plate 5 is around 1 mm, it is preferable that the width of one region 22 or 23 is approximately between or equal to 20 μm and 200 μm, and spacing between the regions 22 and between the regions 23 is approximately between or equal to 30 μm and 300 μm, since these ranges enhance the chromatic homogeneity.

In addition, a method for producing the color conversion plate 5 according to the third embodiment is the same as the production method of the conversion plate 5 according to the first embodiment, except that each of the concave portions 41 and 141 formed on the substrate (region 21) has a stripe-like shape, being arranged in parallel.

<Fourth Embodiment>

Figure 8:
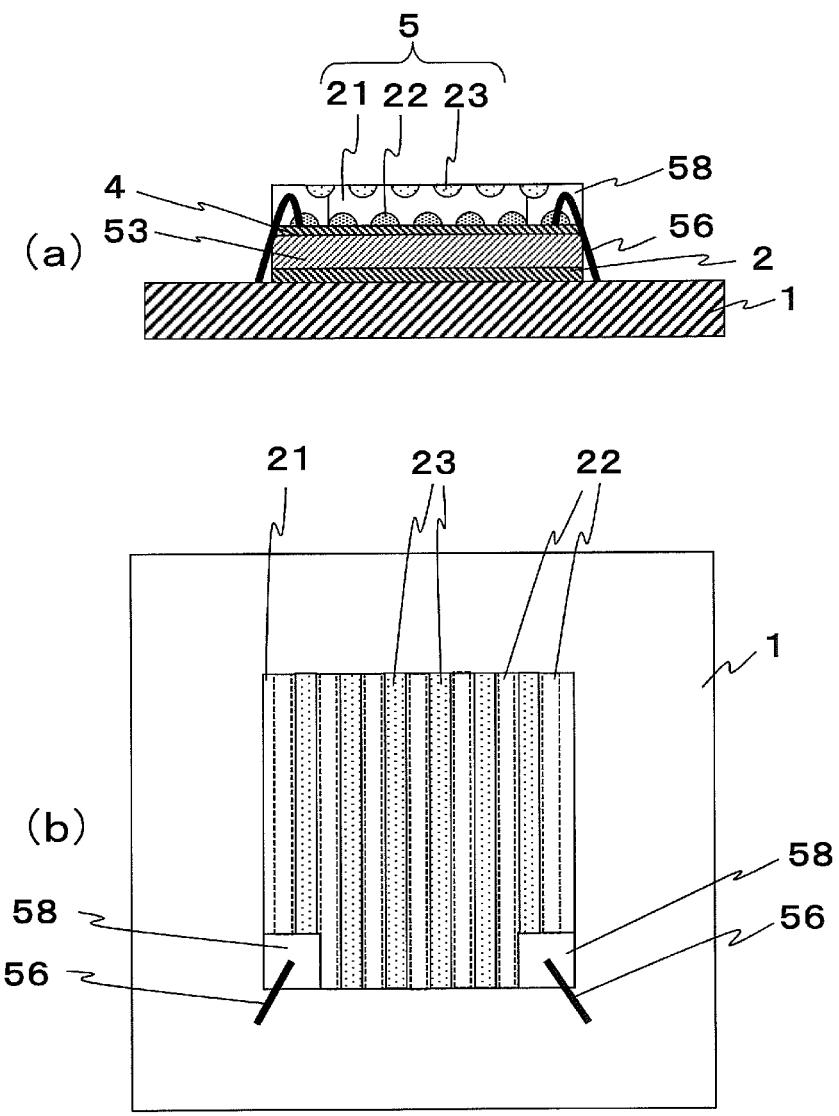
FIG. 8(a) illustrates a sectional view and FIG. 8(b) illustrates a top view of a semiconductor light emitting device according to the fourth embodiment.

As a fourth embodiment, FIG. 8(a) and FIG. 8(b) illustrate the light emitting device which uses a color conversion plate 5 having the same structure as the third embodiment, employing the MB element as the semiconductor light emitting element 53. FIG. 8(a) illustrates a sectional view and FIG. 8(b) illustrates a top view of the semiconductor light emitting device.

In the same manner as the light emitting device using the MB element 53 according to the second embodiment, a notch 58 is formed on the color conversion plate 5 so as to avoid the region where the bonding wire 56 of the MB element 53 is bonded. The structure of the MB element 53 is the same as that of the second embodiment, and the structure and operation of the color conversion 5 are the same as the third embodiment. Therefore, a detailed explanation will not be made.

<Fifth Embodiment>

Figure 9:
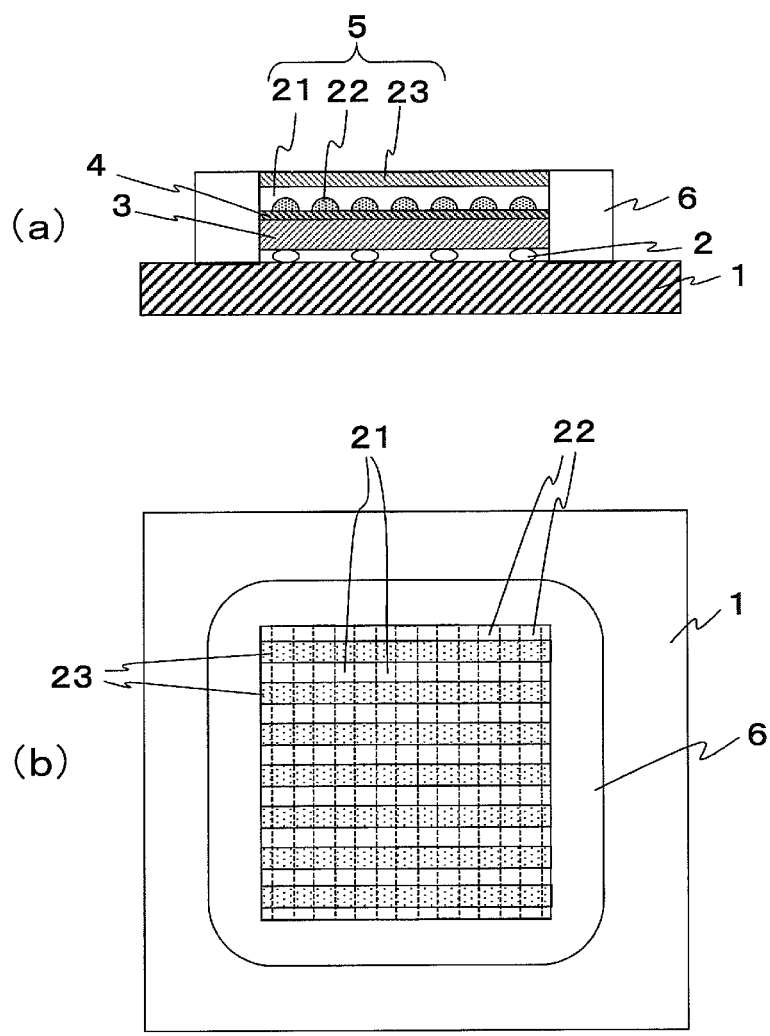
FIG. 9(a) illustrates a sectional view and FIG. 9(b) illustrates a top view of a semiconductor light emitting device according to the fifth embodiment.

Next, a light emitting device according to a fifth embodiment will be explained. As shown in FIG. 9(a) and FIG. 9(b) respectively illustrating a sectional view and a top view of the light emitting device of the fifth embodiment, each of the red phosphor region 22 and the green phosphor region 23 has a stripe-like shape with a half-circle section, in the same manner as the light emitting device according to the third embodiment. However in the fifth embodiment, the axial direction of the red phosphor region 22 is arranged in such a manner as orthogonal to the axial direction of the green phosphor region 23. In other words, the red phosphor regions 22 and the green phosphor regions 23 are arranged in a reticular pattern. Since the configuration of the light emitting device other than this point is the same as that of the third embodiment, tedious explanations will not be made.

Figure 10:
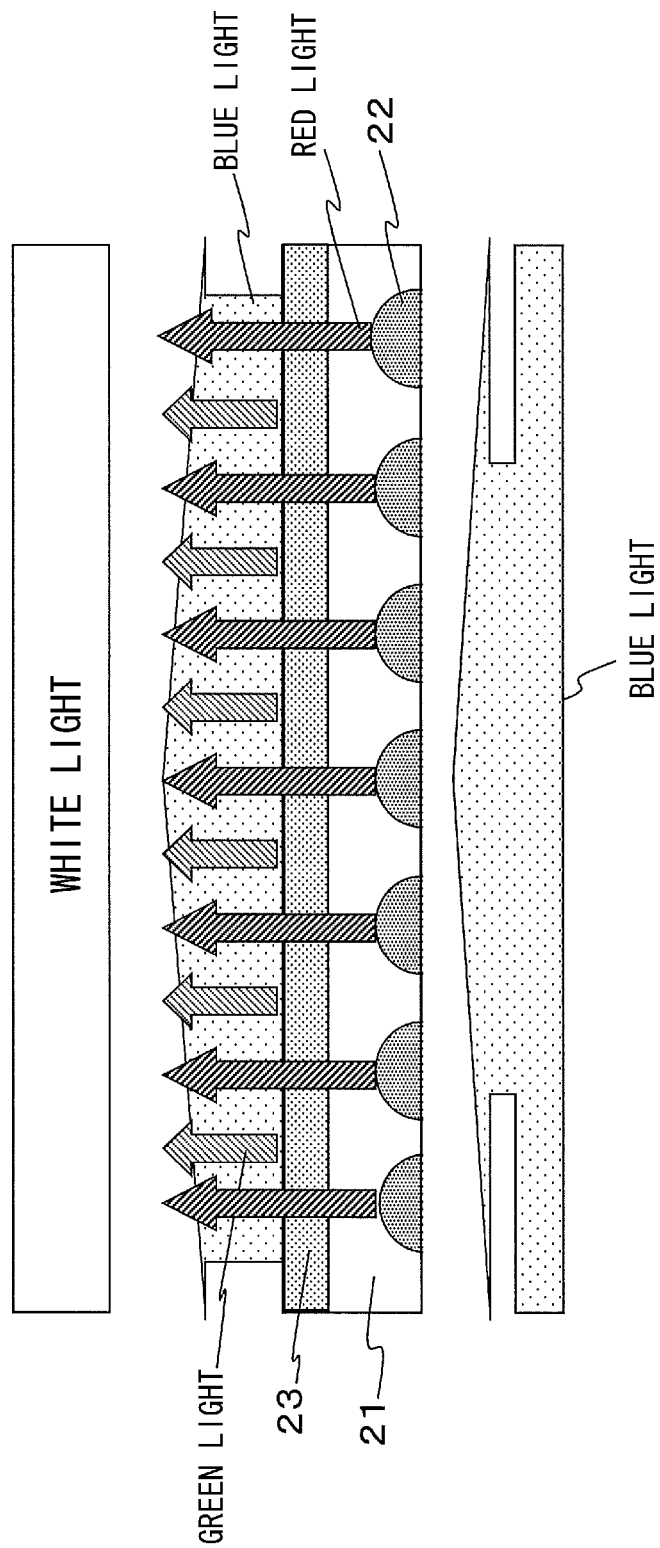
FIG. 10 illustrates an operation of the color conversion plate 5 of the semiconductor light emitting device shown in FIG. 9.

The blue light outputted from the light emitting element 3 passes through the color conversion plate 5, whereby a part of the blue light is converted into red fluorescence and green fluorescence as shown in FIG. 10. In addition, a part of the blue light directly passes through the transparent region 21, or transmits without absorbed by the red phosphor region 22 and the green phosphor region 23. By mixing those light elements, white light is obtained. Such operations as described above are the same as that of the third embodiment.

In the fifth embodiment, the stripe-like red phosphor regions 22 and green phosphor regions 23 are arranged in such a manner as orthogonal to each other, achieving a configuration that quadrangular transparent regions 21 are arranged vertically and horizontally at the positions where the spacing between the red phosphor regions 22 and the spacing between the green phosphor regions 23 superimpose one on another, when viewed from the top of the color conversion plate 5. The blue light from the light emitting element 3 directly passes through the color conversion plate 5 via these transparent regions 21, and therefore, the light emitting device of the fifth embodiment has a structure more suitable for intensifying the blue light, than the light emitting device according to the fourth embodiment.

The light emitting device according to the fifth embodiment has the same method for producing the color conversion plate 5 as the first embodiment, other than that each of the concave portions 41 and 141 formed on the substrate (region 21) has the stripe-like shape and the stripes are orthogonal to each other.

<Sixth Embodiment>

Figure 11:
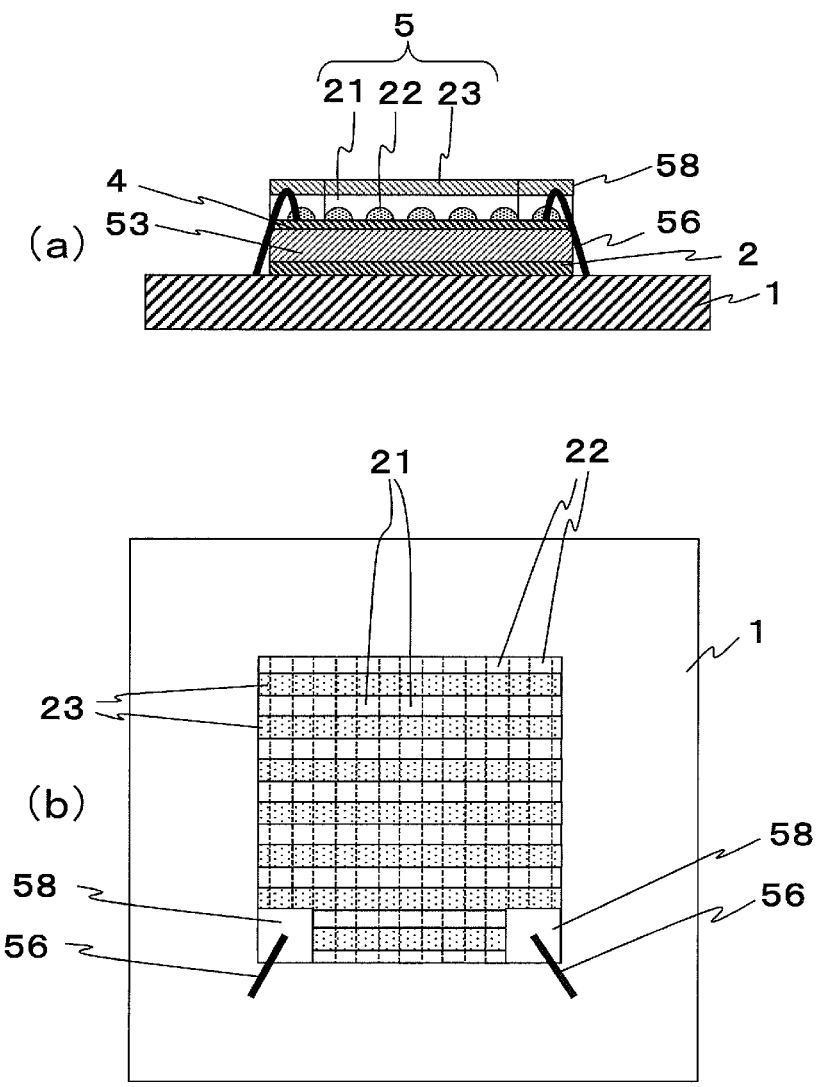
FIG. 11(a) illustrates a sectional view and FIG. 11(b) illustrates a top view of a semiconductor light emitting device according to the sixth embodiment.

As a sixth embodiment, FIG. 11(a) and FIG. 11(b) illustrate the light emitting device which uses a color conversion plate 5 having the same structure as the fifth embodiment, employing the MB element as the semiconductor light emitting element 53. FIG. 11(a) illustrates a sectional view and FIG. 11(b) illustrates a top view of the semiconductor light emitting device.

In the same manner as the light emitting device using the MB element 53 according to the fourth embodiment, a notch 58 is formed on the color conversion plate 5 so as to avoid the region where the bonding wire 56 of the MB element 53 is bonded. Since the structure and the operation of the MB element 53 are the same as that of the fifth embodiment, a detailed explanation will not be made.

<Seventh Embodiment>

Figure 12:
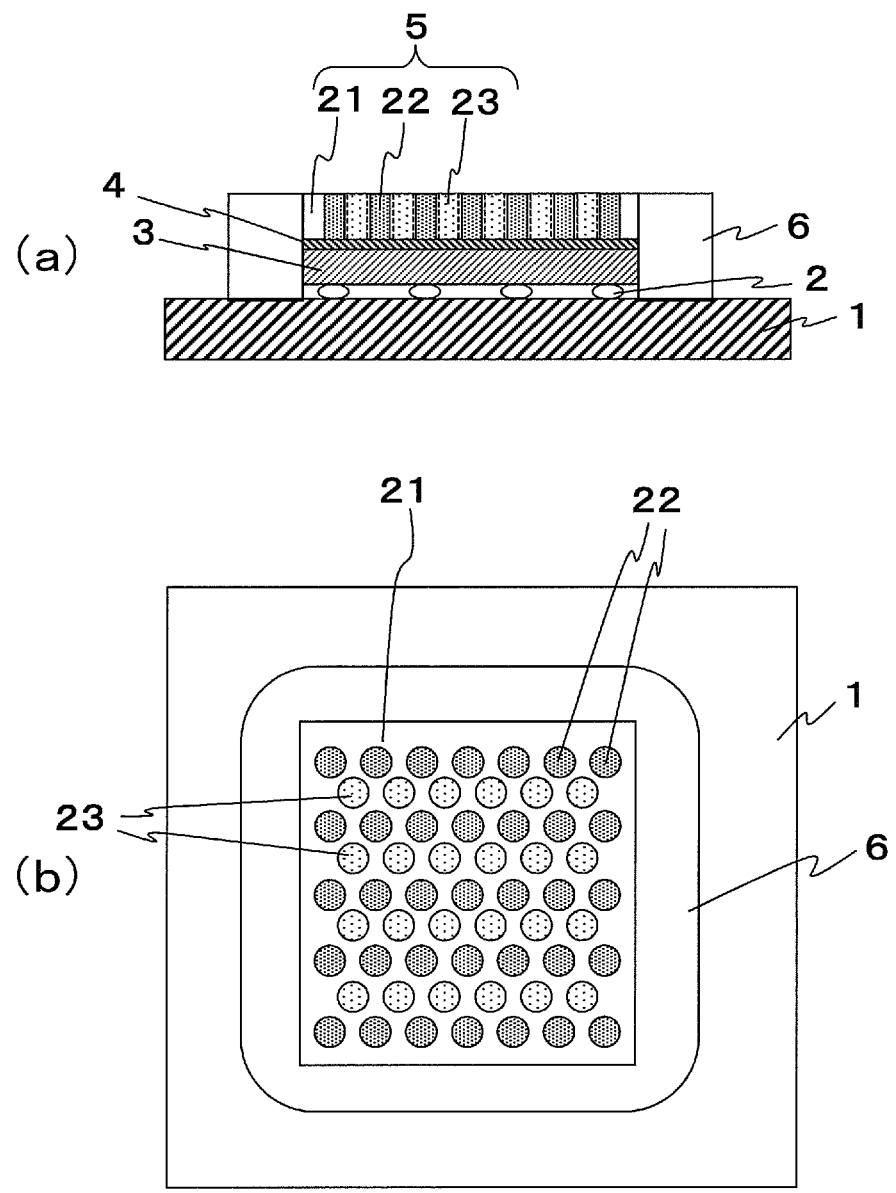
FIG. 12(a) illustrates a sectional view and FIG. 12(b) illustrates a top view of a semiconductor light emitting device according to the seventh embodiment.

Next, a light emitting device according to the seventh embodiment will be explained. As showing in FIG. 12(a) and FIG. 12(b), respectively being a sectional view and a top view of the light emitting device of the seventh embodiment, the color conversion plate 5 has multiple cylindrical red phosphor regions 22 and green phosphor regions 23, penetrating in the thickness direction of the transparent region (substrate) 21. Those multiple red phosphor regions 22 and green phosphor regions 23 are arranged in such a manner as being positioned alternately when viewed from the top of the color conversion plate 5. Other configuration is the same as the first embodiment.

Figure 13:
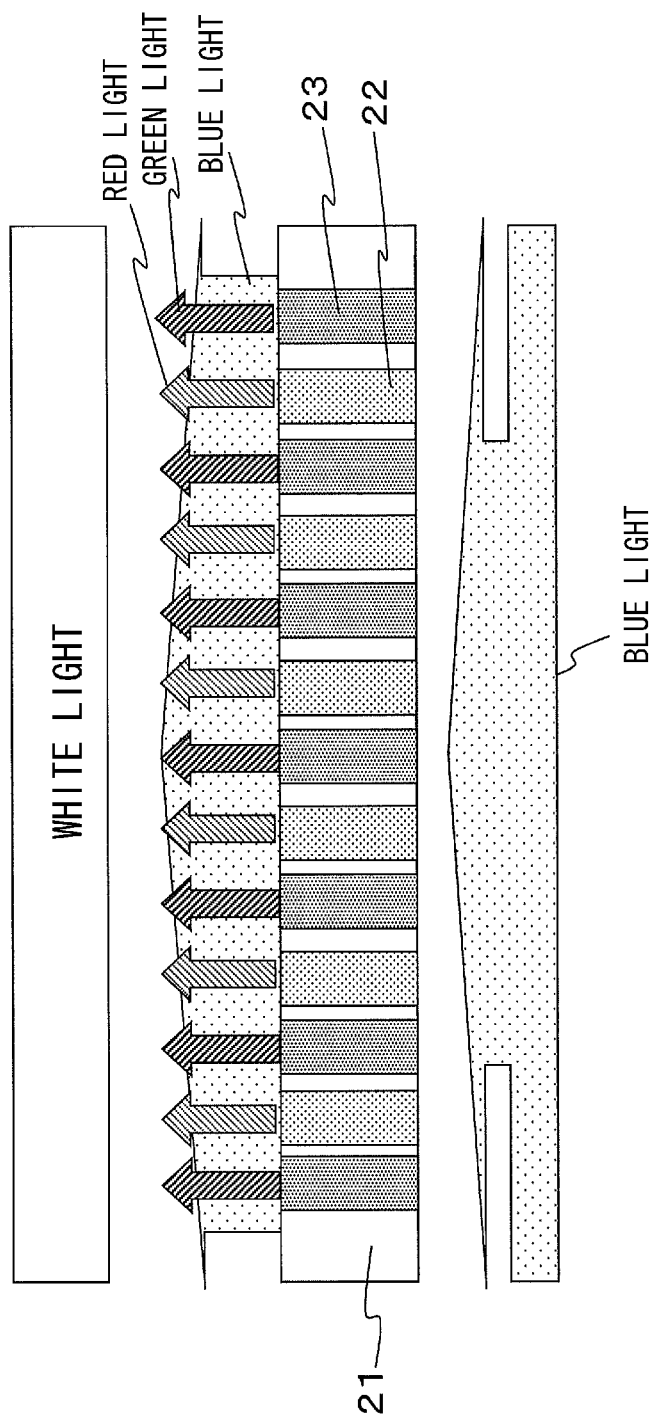
FIG. 13 illustrates an operation of the color conversion plate 5 of the semiconductor light emitting device shown in FIG. 12.

In the light emitting device according to the present embodiment, blue light outputted from the light emitting element 3 transmits the transparent adhesion layer 4, and enters the lower surface (the surface on the light emitting element 3 side) of the color conversion plate 5. As shown in FIG. 13, it is configured such that the cylindrical red phosphor regions 22 and green phosphor regions 23 are exposed on the lower surface of the color conversion plate 5, with constant spacing therebetween, and the transparent region 21 exists between the those regions. Therefore, the blue light simultaneously enters the red phosphor regions 22, the green phosphor regions 23, and the transparent region 21. Accordingly, the red phosphor region 22 emits the red fluorescence, the green phosphor region 23 emits the green fluorescence, and then, they are outputted from the upper surface of the color conversion plate 5. In addition, the blue light that passed through the transparent region 21, and the blue light not absorbed by each of the phosphor regions 22 and 23 are outputted from the upper surface of the color conversion plate 5. With this configuration, white light obtained by mixing the red light, green light, and blue light is outputted from the upper surface of the color conversion plate 5.

Most of the red fluorescence generated in the red phosphor region 22 passes through the cylindrical region and outputs from the upper surface without any change. A part of the red fluorescence enters the transparent region 21 from the side surface of the cylindrical red phosphor region 22, and then enters the green phosphor region 23. On this occasion, an absorption edge of the green phosphor absorption spectrum is located on the shorter wavelength side than the red light wavelength range, as shown in FIG. 3. Therefore, the red fluorescence is allowed to pass through without being absorbed by the green phosphor region 23 and the intensity of the red fluorescence is not attenuated.

On the other hand, most of the green fluorescence generated in the green phosphor region 23, is directed upwardly along the cylindrical green phosphor region 23, and outputted from the upper surface. On the other hand, a part of the green fluorescence enters the transparent region 21 from the side surface of the cylindrical green phosphor region 23, and enters the adjacent red phosphor region 22. On this occasion, since the absorption edge of the absorption spectrum of the red phosphor partially covers the wavelength range of the green light as shown in FIG. 3, the red phosphor absorbs the green fluorescence. However, most of the green fluorescence directed upwardly is allowed to reach the upper surface of the color conversion plate 5, without passing through the red phosphor region 22, and therefore, enabling the green phosphor to output with little attenuation.

In addition, the side surface of the light emitting device 3 and the color conversion plate 5 are surrounded by the light reflection frame 6, and therefore the light outputted from the side surface of the transparent substrate of the light emitting device 3 is allowed to be efficiently guided to the color conversion plate 5. Accordingly, it is possible to enhance color conversion efficiency and output efficiency of the color conversion plate 5.

It is to be noted that the homogeneity in chromaticity and brightness of the white light is influenced by the diameter of the red phosphor region 22 and green phosphor region 23. Therefore, the diameter is adjusted so that necessary chromatic homogeneity can be obtained. If one side of the color conversion plate 5 is around 1 mm, it is preferable that the diameter of each of the red phosphor regions 22 and green phosphor regions 23 is approximately between or equal to 20 µm and 200 µm, and spacing between the region 22 and the region 23 is approximately between or equal to 20×√2 µm and 200×√2 µpm, since these ranges enhance the chromatic homogeneity.

Since other operations and effects of the light emitting device according to the seventh embodiment are the same as those of the first embodiment, tedious explanations will not be made.

Hereinafter, a method for producing the color conversion plate 5 according to the seventh embodiment will be explained with reference to FIG. 14(a) to FIG. 14(d). Since most of the production method is the same as that of the first embodiment as shown in FIG. 4(a) to FIG. 4(d), only the differences will be explained. Cylindrical through-holes 41 and 141 are formed in advance on the substrate (region 21). As a method for forming the holes, transcriptional molding using a die, a hole-drilling using a laser or a precision drill, or the like, may be employed.

Next, as shown in FIG. 14(b), a mask 151 is placed on the substrate, the mask having a shape being provided with an opening at the position of the through-hole 141 and covering the through-hole 41, and the through-hole 141 is filled with a thermosetting resin 142 in which a predetermined concentration of the green phosphor is dispersed, by using the squeegee printing method or the like, and then the thermosetting resin is hardened. The resin being filled forms the green phosphor region 23.

Next, as shown in FIG. 14(c), a mask 152 is placed on the substrate, the mask having a shape being provided with an opening at the position of the through-hole 41 and covering the through-hole 141, and the through-hole 41 is filled with a thermosetting resin 42 in which a predetermined concentration of the red phosphor is dispersed, by using the squeegee printing method or the like, and then the thermosetting resin is hardened. The resin being filled forms the red phosphor region 22.

Finally, as shown in FIG. 14(d), the substrate is cut into a predetermined size, by using the cutting blade 43 or the like, thereby producing the color conversion plate 5.

The light emitting device according to the seventh embodiment may bring about following effects, compared to the light emitting device as described in the aforementioned first to sixth embodiments:

(1) The blue light outputted from the semiconductor light emitting element 3 is allowed to enter the same plane (the lower surface of the color conversion plate 5), with respect to the red phosphor region 22, the green phosphor region 23, and the transparent region 21.
(2) The red light outputted from the red phosphor region 22, the green light outputted from the green phosphor region 23, and the blue light transmitting the transparent region 21 are extracted to the outside efficiently, since there is no shielding in the light outputting direction.
(3) The red light outputted from the red phosphor region 22, the green light outputted from the green phosphor region 23, and the blue light transmitting the transparent region 21 are mixed efficiently, since these regions are adjacent to one another.

It is to be noted that in the seventh embodiment, the refraction index of the base resin in the green phosphor region 23 for the green fluorescence may be made to be higher than the refraction index of the transparent region 21 for the green fluorescence. With this configuration, the green phosphor region 23 serves as a waveguiding structure, generated fluorescence is trapped in the green phosphor region 23, propagating inside, and outputted from the upper surface. Therefore, it is not absorbed by the red phosphor region 22, thereby enhancing the extraction efficiency of the green fluorescence. Similarly, the refraction index of the base resin in the red phosphor region 22 for the red fluorescence may be made to be higher than the refraction index of the transparent region 21 for the red fluorescence. With this configuration, it is possible that the red phosphor region 22 serves as a waveguiding structure.

<Eighth Embodiment>

Figure 15:
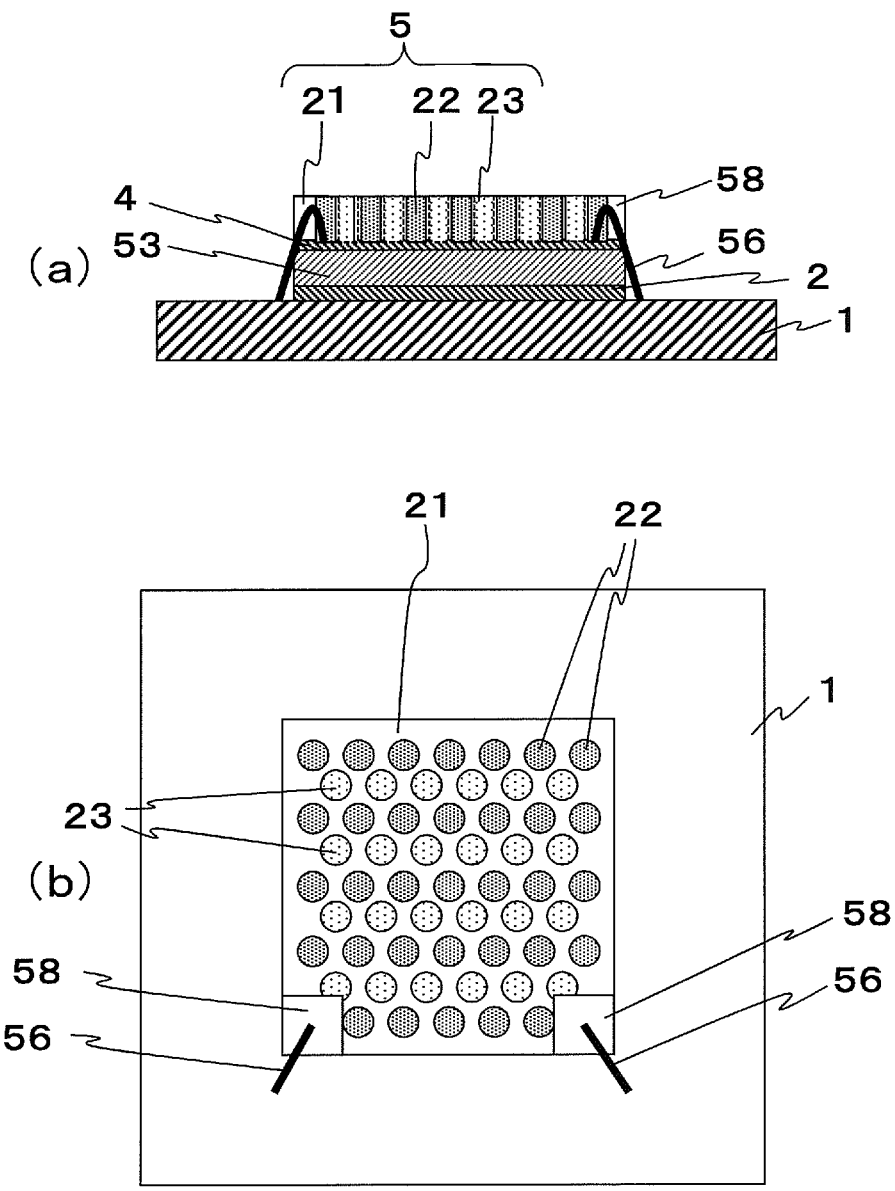
FIG. 15(a) illustrates a sectional view and FIG. 15(b) illustrates a top view of a semiconductor light emitting device according to the eighth embodiment.

As an eighth embodiment, FIG. 15(a) and FIG. 15(b) illustrate the light emitting device which uses a color conversion plate 5 having the same structure as the seventh embodiment, employing the MB element as the semiconductor light emitting element 53. FIG. 15(a) illustrates a sectional view and FIG. 15(b) illustrates a top view of the light emitting device.

In the same manner as the light emitting device using the MB element 53 according to the second embodiment, a notch 58 is formed on the color conversion plate 5 so as to avoid the region where the bonding wire 56 of the MB element 53 is bonded. The structure of the MB element 53 is the same as that of the second embodiment, and the structure and operation of the color conversion 5 are the same as the seventh embodiment. Therefore, a detailed explanation will not be made.

Figure 16:
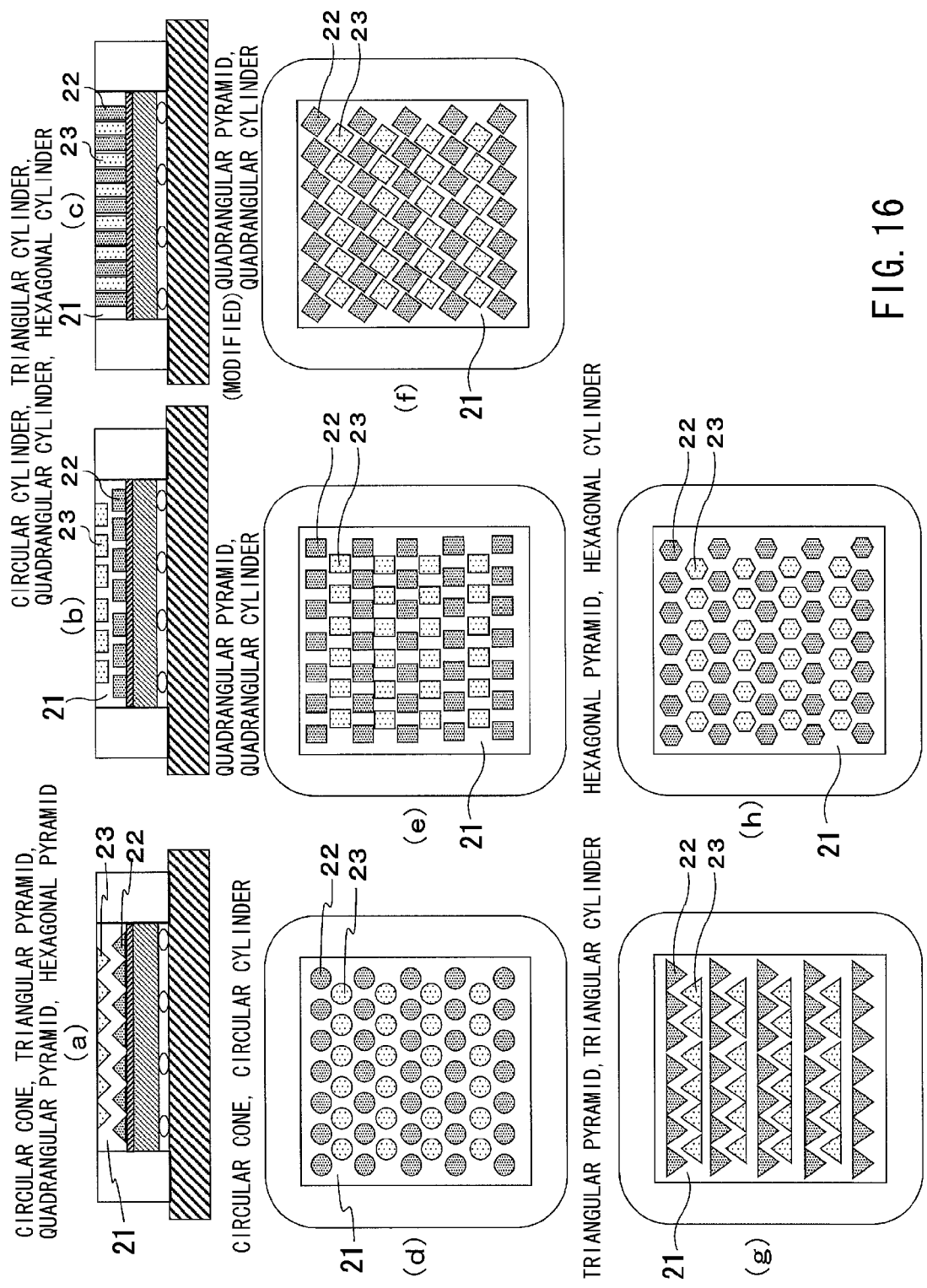
FIG. 16(a) to FIG. 16(c) are cross sectional views showing shape variations of the regions 22 and 23 in the semiconductor light semiconductor device according to the present embodiments and FIG. 16(d) to FIG. 16(h) are top views showing shape variations of the regions 22 and 23 in the semiconductor light semiconductor device according to the present embodiments.

In the aforementioned embodiments from the first to the eighth, explanations have been made for the case where the red phosphor region 22 and the green phosphor region 23 have a shape like a hemisphere, half cylinder, and circular cylinder. However, these are not limited examples. By way of example, it is further possible that the shape may be a circular cone and a polygonal pyramid, such as a triangular pyramid, a quadrangular pyramid, and a hexagonal pyramid, a circular cylinder, and a polygonal cylinder, such as a triangular cylinder, a quadrangular cylinder, and a hexagonal cylinder, when viewed from the side as illustrated in FIG. 16(a), FIG. 16(b), and FIG. 16(c). In addition, any shape of curved surface other than those described above may be applicable.

It is further possible that the red phosphor region 22 and the green phosphor region 23 protrude from the lower surface and the upper surface of the color conversion plate 5. Any desired shape is applicable for the protruding portion. For example, it may be a shape like a hemisphere, half cylinder, and circular cylinder, a shape of a circular cone, a polygonal pyramid such as a triangular pyramid, a quadrangular pyramid, and a hexagonal pyramid, a shape of circular cylinder, and a polygonal cylinder, such as a triangular cylinder, a quadrangular cylinder, and a hexagonal cylinder. In addition, any shape of curved surface other than those described above may be applicable. It is also possible that the protruding portion is a transparent body without phosphor dispersed therein.

In the case of the color conversion plate 5 according to the first, second, seventh, and eighth embodiments, the shape and arrangement of the red phosphor region 22 and the green phosphor region 23 viewed from the top may also be configured as shown in FIG. 16(d) to FIG. 16(h). Alternatively, the red phosphor region 22 and the green phosphor region 23 viewed from the top may be variously arranged in a manner other than the arrangements as shown in FIG. 16(d) to FIG. 16(h). By way of example, the red phosphor region 22 and the green phosphor region 23 may be alternately arranged on each vertex of grid squares.

In each of the aforementioned embodiments, the red phosphor region 22 and the green phosphor region 23 are formed using a base material such as a resin where a phosphor is dispersed. However, filling of the phosphor may be directly performed according to a dry gunning method, or the like, without using the base material.

It is further possible that a filler and pigment such as a diffusing material may be dispersed as appropriate in the transparent region 21, the red phosphor region 22, and the green phosphor region 23.

Effects of the embodiments of the present invention will be summarized as the following:

(1) As in the case of the first to the sixth embodiments, the red phosphor region 22 is arranged on the surface (lower surface) of the color conversion plate 5 on the light emitting element 3 side, and the green phosphor region 23 is arranged on the upper surface (surface on the light outputting side). Accordingly, the light from the light emitting element 3 efficiently enters the regions 22 and 23.
(2) As in the case of the first to the sixth embodiments, two-dimensional arrays of the red phosphor regions 22 and that of the green phosphor regions 23 are arranged in offset manner so that the center positions or the center axes thereof do not overlap each other, or those regions are orthogonal to each other. Accordingly, light emission from each phosphor can be efficiently extracted to the outside.

(3) As in the case of the seventh and the eighth embodiments, through-holes are provided in the color conversion plate 5, from the lower surface on the light emitting element 3 side to the upper surface of the color conversion plate 5, and the red phosphor region 22 and the green phosphor region 23 are arranged in a shape of circular cylinder with a predetermined spacing therebetween. Accordingly, the light from the light emitting element 3 efficiently enters the regions 22 and 23, thereby enhancing the exciting efficiency of each phosphor.

(4) As in the case of the seventh and the eighth embodiments, the red phosphor region 22 and the green phosphor region 23 are alternately arranged in such a manner as adjacent to each other. Accordingly, it is possible to efficiently extract the light emission from each phosphor.

The light emitting device according to the present invention may be applicable as an LED light source for a lighting system such as an LCD backlight, a general lighting, and a street light, for instance.

What is claimed is:

1. A semiconductor light emitting device comprising,
   a light emitting element, and
   a color conversion plate being mounted on the light emitting element, the color conversion plate containing at least a first phosphor and a second phosphor which absorb light emitted from the light emitting element to output fluorescence, wherein,
   the color conversion plate has multiple first regions defined by multiple first concave portions filled with material including the first phosphor on a surface of its light emitting element side, the first concave portions being arranged with a predetermined spacing therebetween, and second regions defined by multiple second concave portions filled with material including the second phosphor on an upper surface of an opposite side of the light emitting element side, the second concave portions being arranged with a predetermined spacing therebetween, and
   a region where the first regions and the second regions are excluded contains no phosphor.

2. The semiconductor light emitting device according to claim 1, wherein, a fluorescent wavelength of the first phosphor is longer than a fluorescent wavelength of the second phosphor.

3. The semiconductor light emitting device according to claim 1, wherein, a center position or a central axis of the first regions does not overlap a center position or a central axis of the second regions, in a principal plane direction of the color conversion plate.

4. The semiconductor light emitting device according to claim 1, wherein, the multiple first regions and the multiple second regions are arranged as one of dots and stripes when viewed from a top of the color conversion plate.

5. The semiconductor light emitting device according to claim 1, wherein, each of the first regions and the second regions has an outer shape of any of the following; a circle, a triangle, a quadrangle, and a polygon, when viewed from a top of the color conversion plate.

6. The semiconductor light emitting device according to claim 1, wherein, each of the first regions and the second regions has an outer shape of any of the following; a semicircle, a triangle, and a quadrangle, when viewed from a side of the color conversion plate.

7. A semiconductor light emitting device comprising,
   a light emitting element, and
   a color conversion plate being mounted on the light emitting element, the color conversion plate containing at least a first phosphor and a second phosphor which absorb light emitted from the light emitting element to output fluorescence, wherein,
   the color conversion plate has multiple first regions and second regions penetrating from a surface on a light emitting element side to an opposed surface, the first regions include the first phosphor and the second regions include the second phosphor, the first regions and the second regions are arranged alternately with a predetermined spacing therebetween when viewed from a top of the conversion plate, and a region excluding the first regions and the second regions contains no phosphor.

8. The semiconductor light emitting device according to claim 7, wherein, each of the first regions and the second regions has a shape of any of the following; a circular cylinder, a triangular cylinder, a quadrangular cylinder, and a polygonal cylinder.

* * * * *